US012061793B1

(12) United States Patent
Musoll et al.

(10) Patent No.: US 12,061,793 B1
(45) Date of Patent: Aug. 13, 2024

(54) CAPACITY-EXPANDING MEMORY CONTROL COMPONENT

(71) Applicant: Astera Labs, Inc., Santa Clara, CA (US)

(72) Inventors: Enrique Musoll, San Jose, CA (US); Anh T. Tran, Elk Grove, CA (US); Subbarao Arumilli, Cupertino, CA (US); Chi Feng, San Jose, CA (US)

(73) Assignee: Astera Labs, Inc., Santa Clara, CA (US)

( * ) Notice: Subject to any disclaimer, the term of this patent is extended or adjusted under 35 U.S.C. 154(b) by 6 days.

(21) Appl. No.: 17/888,264

(22) Filed: Aug. 15, 2022

Related U.S. Application Data

(63) Continuation-in-part of application No. 17/534,327, filed on Nov. 23, 2021, now Pat. No. 11,722,152.

(60) Provisional application No. 63/118,595, filed on Nov. 25, 2020.

(51) Int. Cl.
*G06F 3/06* (2006.01)
*H03M 13/15* (2006.01)

(52) U.S. Cl.
CPC .......... *G06F 3/0608* (2013.01); *G06F 3/0629* (2013.01); *G06F 3/0673* (2013.01); *H03M 13/1515* (2013.01)

(58) Field of Classification Search
CPC . G11C 2029/3602; G11C 29/36; G11C 29/42; H03M 13/095; H03M 13/1515; H03M 13/1575; G06F 3/0608; G06F 3/0629; G06F 3/0673
See application file for complete search history.

(56) References Cited

U.S. PATENT DOCUMENTS

| | | | | |
|---|---|---|---|---|
| 4,507,779 | A * | 3/1985 | Barner, Jr. | H04J 3/07 714/707 |
| 4,541,091 | A * | 9/1985 | Nishida | G11B 20/1809 |
| 4,541,092 | A * | 9/1985 | Sako | H03M 13/15 |
| 4,607,367 | A * | 8/1986 | Ive | G11B 20/1809 |
| 5,010,554 | A * | 4/1991 | Bechtel | H04L 1/0057 714/759 |
| 5,051,998 | A * | 9/1991 | Murai | G11B 20/1809 |

(Continued)

OTHER PUBLICATIONS

Intel Corporation, "Intel Xeon Processor E5-1600/2400/2600/4600 v3 Product Families Datasheet—vol. 2: Registers," Jun. 2015, 414 pages.

(Continued)

*Primary Examiner* — Albert Decady
*Assistant Examiner* — Enamul M Kabir
(74) *Attorney, Agent, or Firm* — Charles Shemwell

(57) ABSTRACT

A decoding engine within an integrated-circuit (IC) component iteratively executes error detection/correction operations with respect to a sequence of input data volumes to generate a corresponding sequence of error syndrome values, the input data volumes each including a first block of data and corresponding error correction code retrieved from one or more external memory components together with a respective one of a plurality of q-bit data patterns. Selector circuitry within the decoding engine selects one of the plurality of q-bit data patterns to be an output q-bit value according to error-count differentiation indicated by the error syndrome values.

25 Claims, 5 Drawing Sheets

(56) References Cited

U.S. PATENT DOCUMENTS

| | | | | |
|---|---|---|---|---|
| 5,430,739 | A * | 7/1995 | Wei | H03M 13/152 714/756 |
| 5,483,236 | A * | 1/1996 | Bi | H03M 13/151 341/94 |
| 5,926,490 | A * | 7/1999 | Reed | G11B 20/10037 714/787 |
| 5,961,658 | A * | 10/1999 | Reed | G11B 20/10277 714/824 |
| 6,009,549 | A * | 12/1999 | Bliss | G11B 20/1833 714/775 |
| 6,332,206 | B1 * | 12/2001 | Nakatsuji | H03M 13/00 |
| 9,569,308 | B1 | 2/2017 | Ware et al. | |
| 10,797,728 | B1 | 10/2020 | Varnica | |
| 2001/0036236 | A1 * | 11/2001 | Kobayashi | G11B 20/10 |
| 2002/0199153 | A1 * | 12/2002 | Fall | H03M 13/00 714/781 |
| 2003/0031236 | A1 * | 2/2003 | Dahlman | H04B 1/7115 375/150 |
| 2010/0299575 | A1 | 11/2010 | Roth et al. | |
| 2012/0121084 | A1 * | 5/2012 | Tomlinson | H04L 9/30 380/30 |
| 2013/0246889 | A1 | 9/2013 | Kumar et al. | |
| 2014/0047265 | A1 | 2/2014 | Das et al. | |
| 2014/0068390 | A1 | 3/2014 | Schmidberger et al. | |
| 2014/0136931 | A1 * | 5/2014 | Nakamura | H03M 13/05 714/785 |
| 2016/0006459 | A1 * | 1/2016 | Hanham | H03M 13/1111 714/764 |
| 2016/0092307 | A1 | 3/2016 | Bonen et al. | |
| 2017/0093528 | A1 * | 3/2017 | Oveis Gharan | G06F 11/10 |
| 2017/0255394 | A1 * | 9/2017 | Suh | G06F 12/06 |
| 2018/0060160 | A1 | 3/2018 | Fang et al. | |
| 2020/0097359 | A1 | 3/2020 | O'Connor et al. | |
| 2020/0401475 | A1 * | 12/2020 | Lu | H03M 13/3746 |
| 2021/0208967 | A1 | 7/2021 | Cha et al. | |
| 2022/0013187 | A1 * | 1/2022 | Santhanam | H03M 13/1545 |
| 2022/0091936 | A1 | 3/2022 | La Fetra | |

OTHER PUBLICATIONS

Molka et al., "Cache Coherence Protocol and Memory Performance of the Intel Haswell-EP Architecture," IEEE 2015, 10 pages.

* cited by examiner

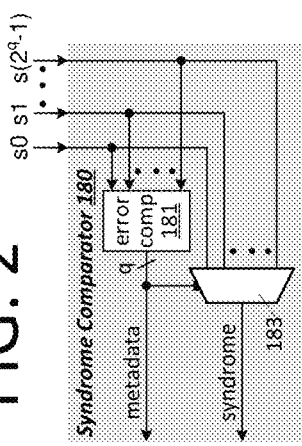

FIG. 2

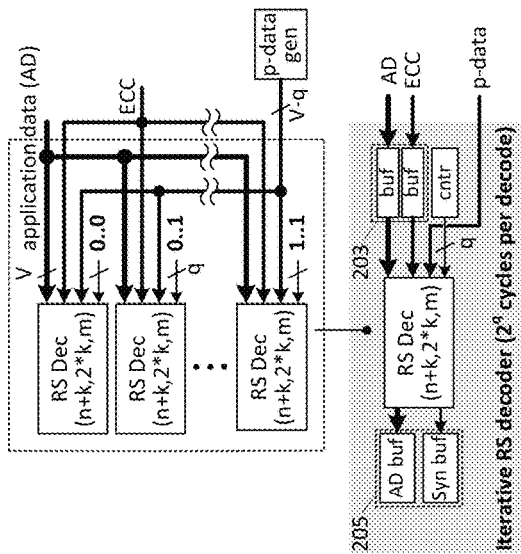

| # Bad Symbols | Syndrome Status | Syndrome Comparator Action |
|---|---|---|
| 0 | one syndrome reports 0 bad symbols<br>other syndromes each report 1 bad symbol | output syndrome reporting fewest bad symbols and encode metadata accordingly (data good, metadata good) |
| 1 to $(n-k)/2$ | one syndrome reports 1 to $(n-k)/2$ bad symbols<br>other syndromes each report 2 to $((n-k)/2)+1$ bad symbols | output syndrome reporting fewest bad symbols and encode metadata accordingly (data good, metadata good) |
| $1+(n-k)/2$ to $n-k-1$ | one syndrome reports 1 to $(n-k)/2$ bad symbols<br>other syndromes each report 2 to $1+(n-k)/2$ bad symbols | output syndrome reporting fewest bad symbols and encode metadata accordingly (data bad, metadata good) |
| $n-k$ | one syndrome reports $n-k$ bad symbols<br>other syndromes each report bogus value | output syndrome reporting $n-k$ bad symbols and encode metadata according to that syndrome |
| $>n-k$ | all syndromes report bogus values | output bogus-valued syndrome with default/don't-care metadata-encoding (data bad, metadata bad) |

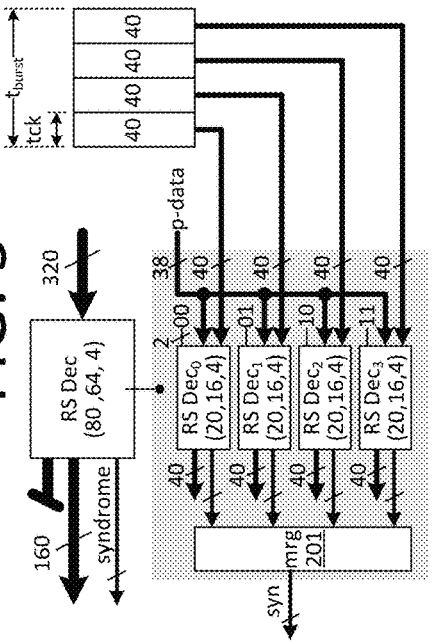

FIG. 5

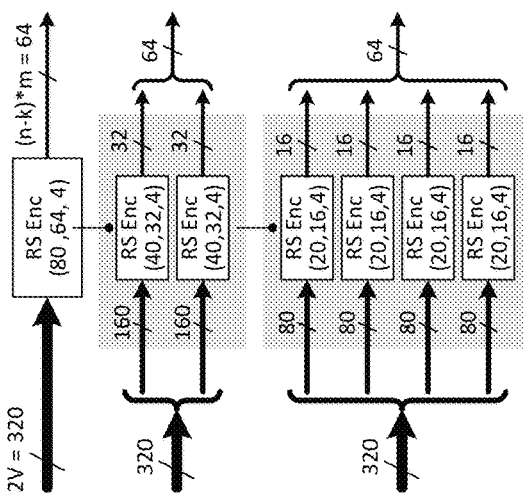

FIG. 4

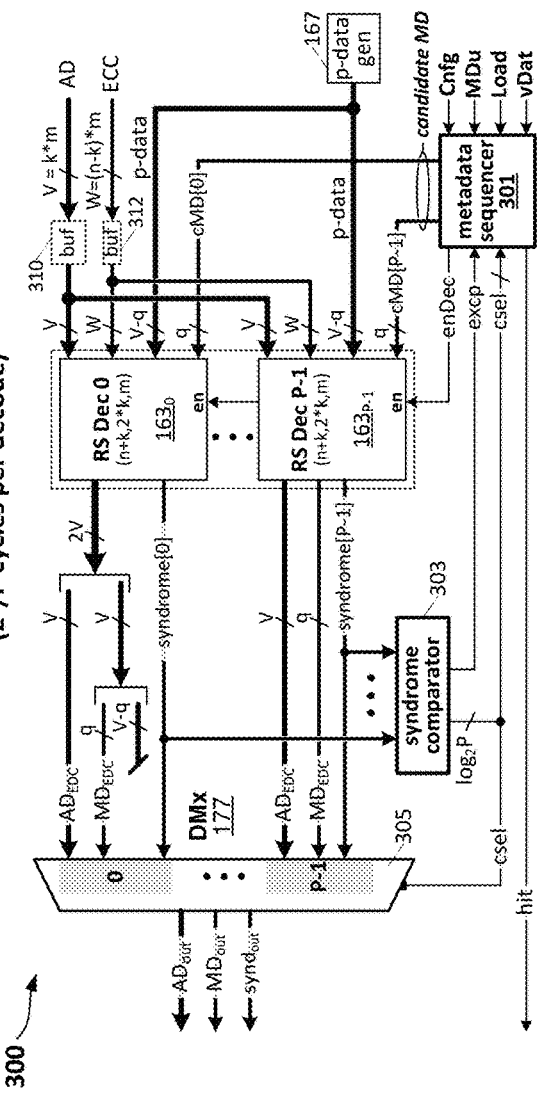
FIG. 7 Iterative Single-Symbol RS Decoding ($2^q/P$ cycles per decode)
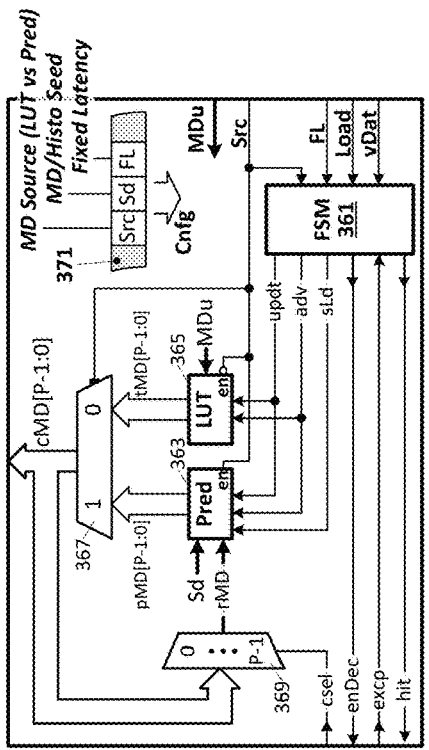
FIG. 9 Metadata Sequencer 360
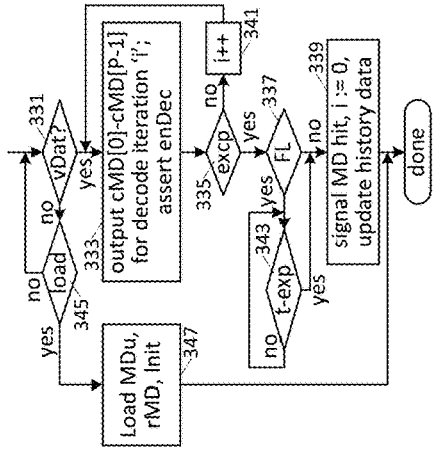
FIG. 8
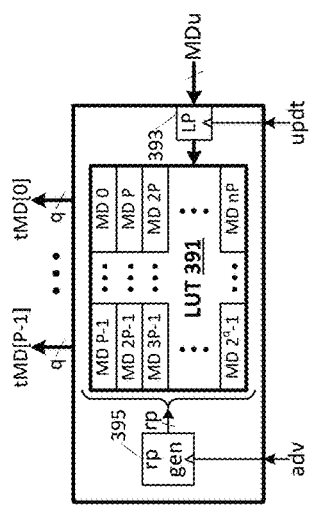
FIG. 10 Tabular Sequencer 390

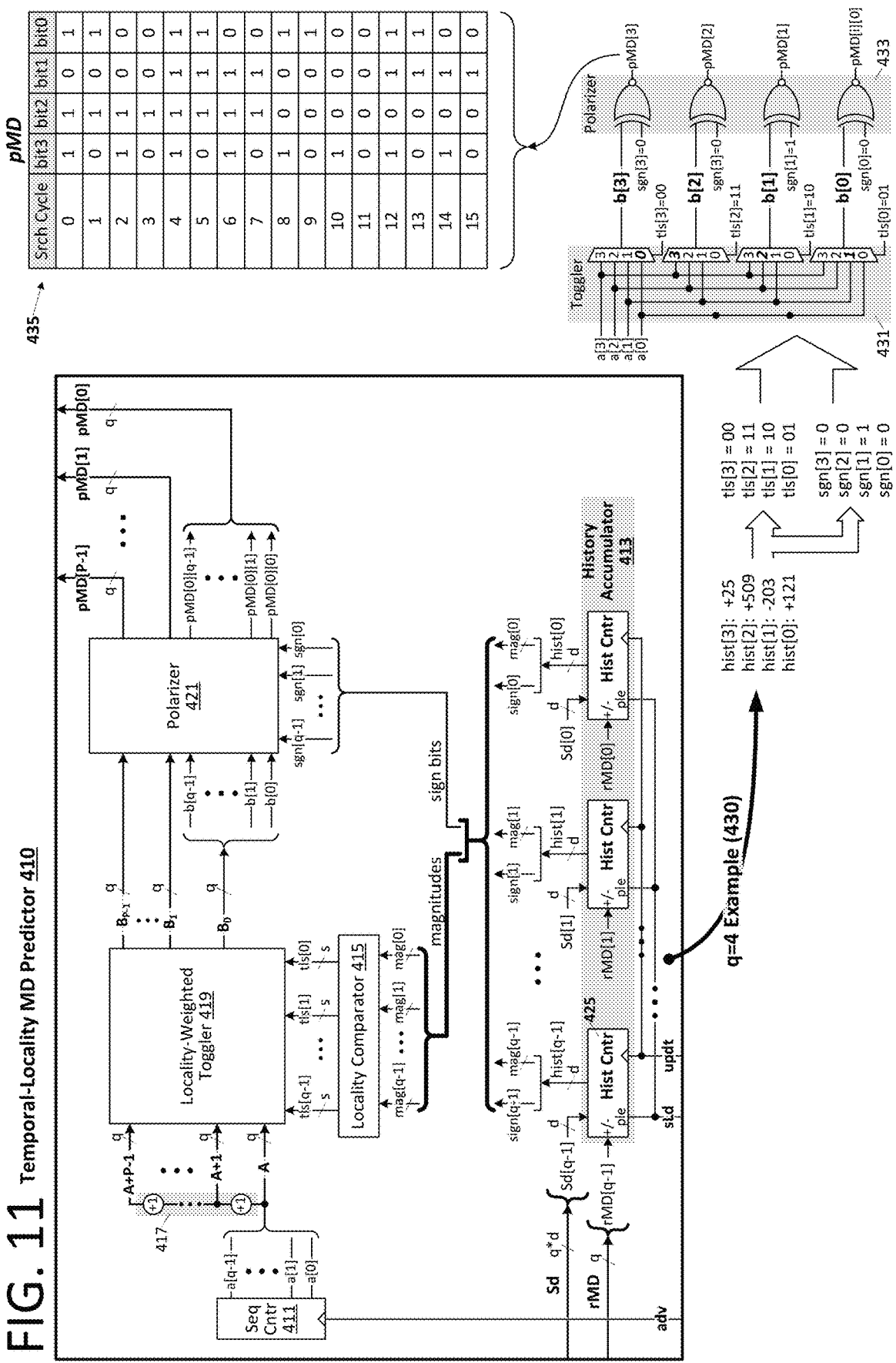
FIG. 11 Temporal-Locality MD Predictor 410

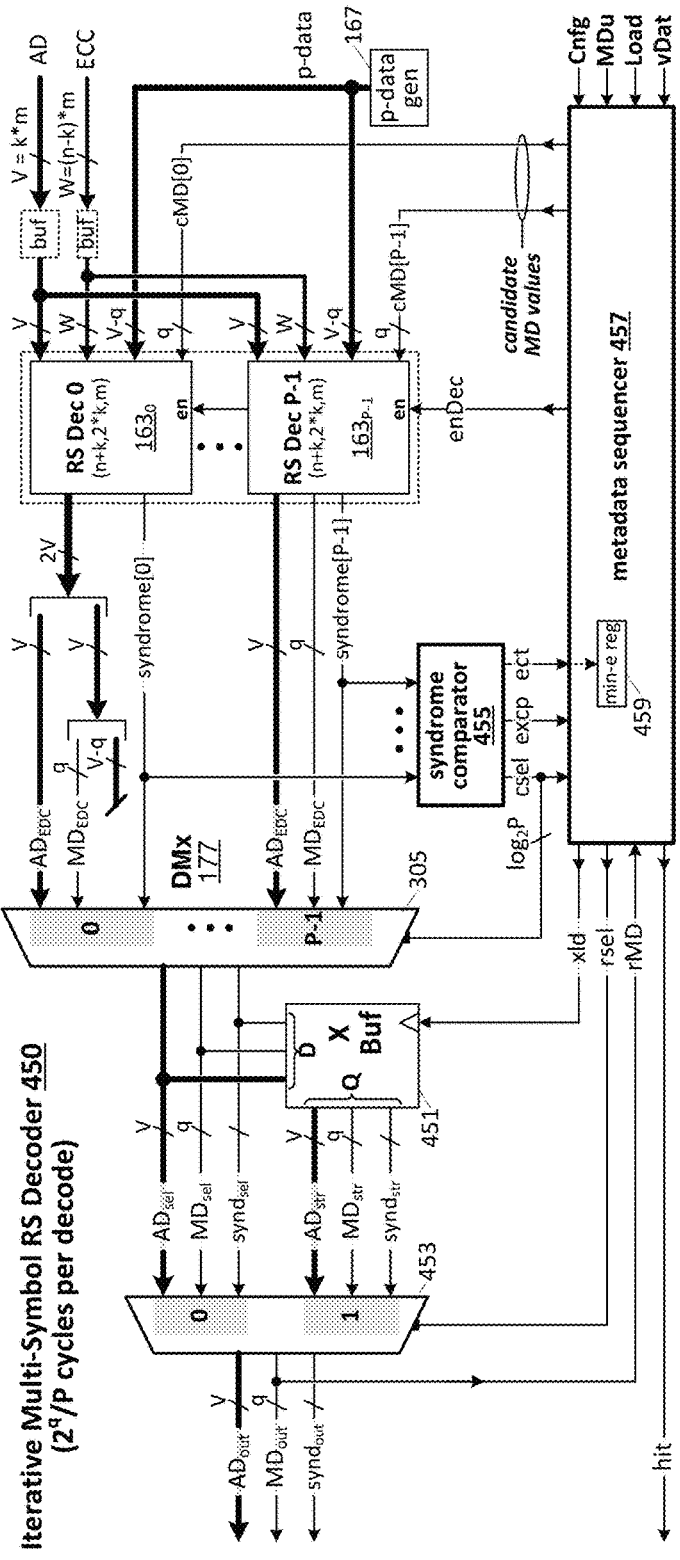
FIG. 12 Iterative Multi-Symbol RS Decoder 450 ($2^q/P$ cycles per decode)
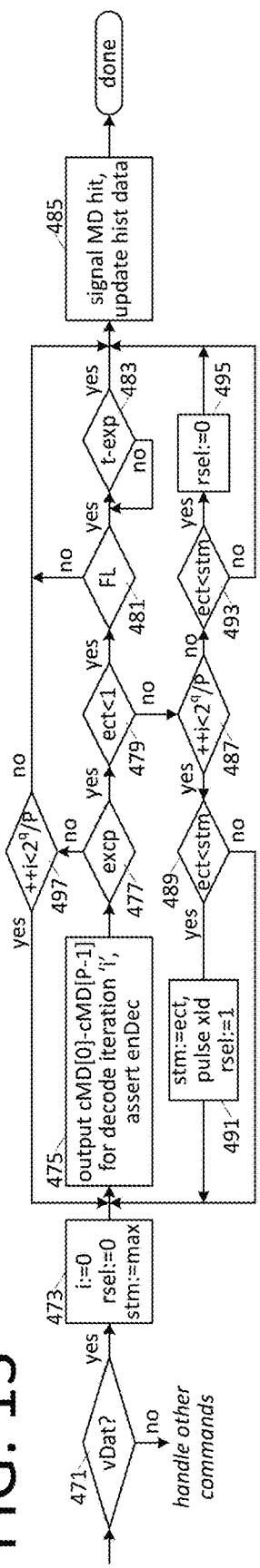
FIG. 13

CAPACITY-EXPANDING MEMORY CONTROL COMPONENT

CROSS REFERENCE TO RELATED APPLICATIONS

This application is a continuation-in-part of U.S. application Ser. No. 17/534,327 filed Nov. 23, 2021, which claims the benefit of U.S. provisional application No. 63/118,595 filed Nov. 25, 2020. Each of the above-identified patent applications is hereby incorporated by reference.

DRAWINGS

The various embodiments disclosed herein are illustrated by way of example, and not by way of limitation, in the figures of the accompanying drawings and in which like reference numerals refer to similar elements and in which:

FIG. 2 illustrates an exemplary syndrome comparator embodiment that may be used to implement the syndrome comparator shown in FIG. 1;

Figure 1:
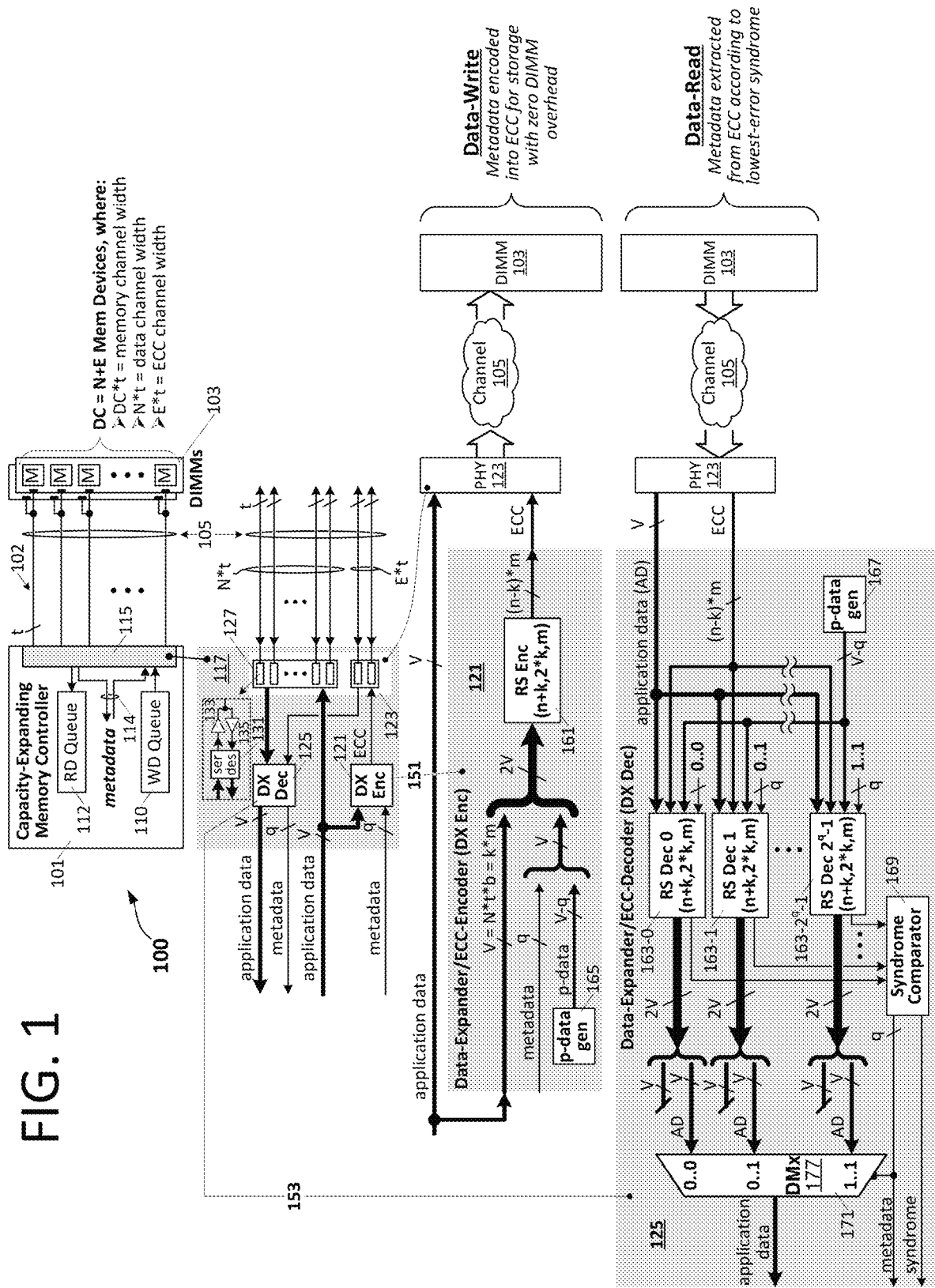
FIG. 1 illustrates an embodiment of a memory system having a capacity-expanding memory control component coupled to one or more dual inline memory modules (DIMMs)

FIG. 3 presents an exemplary listing/tabulation of actions implemented by the FIG. 2 syndrome comparator for various syndrome status conditions and corresponding bad-symbol counts in the case where metadata size is less than or equal to Reed-Solomon (RS) symbol size;

FIG. 4 illustrates an exemplary RS encoder implemented by two or more component RS encoders;

FIG. 5 illustrates an exemplary RS decoder likewise be implemented by two or more component RS decoders; and FIG. 6 illustrates exemplary application of a single RS decoder to iteratively execute multiple RS decode operations with respect to the same application data block;

FIG. 7 illustrates an embodiment of an single-symbol opportunistic RS decoder having a metadata sequencer, pattern-data generator, data-expanded RS decoders, syndrome comparator, and candidate multiplexer;

FIG. 8 illustrates an exemplary operation of the metadata sequencer of FIG. 7 in response to incoming control signals;

FIG. 9 illustrates an exemplary metadata sequencer capable of executing the opportunistic sequencing and data-load/update operations shown in FIG. 8 and that may implement the metadata sequencer shown in FIG. 7;

FIG. 10 illustrates an embodiment of a tabular sequencing engine having a metadata look-up table, row-pointer generator and load port;

FIG. 11 illustrates an embodiment of a temporal-locality metadata predictor that may be deployed as the predictive sequencing engine in FIG. 9;

FIG. 12 illustrates an embodiment of an opportunistic RS decoding engine capable of multi-symbol metadata recovery; and FIG. 13 illustrates an exemplary operational flow implemented by a finite state machine, processor or other control circuitry within the metadata sequencer of FIG. 12.

DETAILED DESCRIPTION

In various embodiments herein a memory control component encodes over-capacity data into an error correction code (ECC) generated for and stored in association with an application data block, inferentially recovering the over-capacity data during application data block read-back by comparing error syndromes generated in detection/correction operations for respective combinations of each possible value of the over-capacity data and the read-back application data block. In a number of embodiments, application data blocks and corresponding data-encoded ECCs are stored within and read back from integrated-circuit memory devices disposed on a dual inline memory module (DIMM), with the ECC-encoded over-capacity data storage increasing the effective data storage capacity of the DIMM in accordance with the relative sizes (volumes, bit-counts) of the application data block and over-capacity data. In applications where the over-capacity data is generated by (and returned upon read-back to) one or more components or entities other than the application data requestor—as in the case of metadata storage required by various high-performance interconnect standards—ECC-encoded over-capacity storage of the metadata obviates both compromised application data storage capacity (e.g., where metadata storage would otherwise consume some portion of the application data storage capacity) and auxiliary hardware storage expense/overhead (i.e., no need for the costly and area-consuming additional memory that plagues conventional metadata storage solutions).

FIG. 1 illustrates an embodiment of a memory system 100 having a capacity-expanding memory control component 101 coupled via data links 102 to one or more DIMMs 103. In the depicted example, memory control component 101 ("controller") includes read and write data queues (110, 112) together with connections (114) to a "metadata" source/destination (which could be the read and write data queues themselves rather than an alternative entity) and an error detecting/correcting data-signaling interface 115, the latter to generate for each outgoing write data block (a volume of "application" data to be stored/written within constituent memory devices of a selected DIMM 103 in a memory write transaction) an error correction code to be stored in DIMM 103 with the write data block. During data read-back, both the application data (the write data block during the memory-write transaction and now, in a subsequent memory read transaction, a read data block) and the corresponding error correction code are output from DIMM 103 to controller 101, the latter (ECC) being applied within data signaling interface 115 to detect and if necessary/possible, correct, corrupted (bad) symbols within the retrieved application data block.

Referring to detail view 117 of signaling interface 115, the metadata and corresponding application data block are applied, during a data write transaction, to data-expander/ECC encoding circuitry 121 which responsively generates a data-dependent ECC—an error correction code that reflects both the application data block and the metadata—outputting the application data block and ECC to a selected DIMM via physical signaling interface 123 (PHY). During subsequent data read-back (i.e., in a memory read transaction), the retrieved-from-memory application data block and ECC (arriving via PHY 123) are applied, in combination with each possible metadata value and thus 24 bit values (or bit patterns) where the metadata is constituted by 'q' bits, to data-expander/ECC decoding circuitry 125 to yield 24 error syndromes—a respective syndrome for each different possible metadata value. Assuming for sake of explanation that there are no bit errors in the read-back application data block or ECC, then whichever of the $2^q$ metadata values supplied to ECC decoder 125 matches the metadata value used to encode the ECC will yield a no-error syndrome (i.e., syndrome value indicating that no errors were detected), distinguishing that specific metadata value from all others (as the syndromes generated using the remaining $2^q-1$ metadata values will all indicate at least one error corresponding to the incorrect metadata value) and thus enabling the originally written metadata value to be recovered (or inferred, extracted) as part of the ECC decoding operation. As a more specific example, where ECC encoding/decoding is implemented as part of a block-based error correction/detection scheme that enables detection of errors with multi-bit symbol granularity (e.g., 4-bit symbol, 8-bit symbol, etc.), the ECC decode operation applying the correct (original-matching) metadata value will produce one fewer symbol errors than all other (incorrect) metadata values—again, enabling recovery of the originally "written" metadata value. Because the size of the stored application data block and corresponding ECC exactly match the data block size and ECC size stored in a conventional memory system, the metadata is effectively stored (as part of the controller ECC encoding) and then retrieved (controller ECC decoding) with zero additional memory consumption within the DIMM. That is, the DIMM capacity available for application data storage (with such data including any type of user data, hardware-generated data, operating-system data, etc.) remains intact and uncompromised, and likewise with the storage space available for ECC—effectively expanding the capacity of the DIMM by a factor of (q+V)/V (where 'V' is the bit-size of the application data block) through additional ECC encoding and decoding.

In the FIG. 1 embodiment and a number of embodiments discussed below, data-expander/encoder 121 executes Reed-Solomon (RS) encoding (i.e., implements an RS encoder) to generate the metadata-dependent ECC during data write, and data-expander/decoder 125 executes $2^q$ RS decoding operations (within one or more RS decoders) during data read—one RS decoding operation for each of the $2^q$ possible metadata values—to both recover the ECC-encoded metadata bits and implement the primary ECC function (detecting/correcting symbol errors). To maintain a power-of-two message size (i.e., number (k) of m-bit symbols constituted by the data supplied to the RS encoder) despite the added metadata bits, the ECC encoders/decoders are enlarged/upgraded (relative to those needed for the application data block alone) to accommodate a message size twice that of the application data block (i.e., 2*V bits, where '*' denotes multiplication) and additional pattern data bits are combined with the metadata as necessary to produce the expanded, double-size data input. More specifically with regard to message size expansion, the V-bit application data block and q-bit metadata are supplemented by V-q (V minus q) bits of deterministic pattern data to form the expanded (2*V-bit) data input to the RS encoder during a data write transaction to a given memory address (yielding the ECC written with the application data block). Likewise, in a subsequent data read transaction directed to that same address, the retrieved application data block (V bits) is supplemented/expanded by the deterministic pattern data (i.e., regenerated within the controller as the pattern data has a predetermined or deterministically generable bit pattern) to form, together with each of the $2^q$ possible metadata values, $2^q$ messages each constituted by 2*V bits and differing only in the metadata value. While the FIG. 1 embodiment and those discussed below present a doubled expansion (i.e., from V to 2*V) of the message size (volume of data supplied to ECC encoder and then again to ECC decoder) relative to the application data block size (V), the message size may more generally be expanded, at least in an RS encoding/decoding scheme, by $2^i$*V, where i=1, 2, 3, ... J, and J is any practicable value.

FIG. 1 illustrates the above-described data-expansion and encoder/decoder enlargement in detail views 151 and 153 (of data-expander/encoder 121 and data-expander/decoder 125, respectively) in the context of RS encoders/decoders parameterized by block size, message size and symbol size (i.e., "n, k, m" where 'm' is the size of a correctable symbol in bits, 'k' is the number of symbols per message (as described above), and 'n' is the total number of symbols per block such that n=k+w, where 'w' is the number of symbols per ECC and also the number of detectable corrupted/bad symbols). That is, RS encoder 161 within data-expander/encoder 121 is enlarged relative to a baseline RS (n, k, m) encoder to implement RS (n+k, 2*k, m) and ditto for each of the RS decoders (163-0 to 163-$2^q$-1) within data-expander/decoder 125—all enlarged from RS (n, k, m) to RS (n+k, 2*k, m).

Still referring to detail views 151 and 153, pattern data generators 165 and 167 are implemented within data-expander/encoder 121 and data-expander/decoder 125, respectively, to produce the pattern data bits ("p-data") merged with the metadata (or each of the possible metadata values within decoder 125) and application data block to yield the expanded (doubled) message size. In differing embodiments, the pattern generators may output either fixed pattern values (e.g., all '1's, all '0's, alternating '1' and '0' patterns or any other fixed/static bit pattern) or dynamic bit patterns. In the latter (dynamic pattern) case, for example, a pseudo-random number generator may be seeded by the memory address of the subject application data block and/or any other fiducial information available within the controller integrated circuit, with temporary storage of any ephemeral value (e.g., memory read address) as necessary to make that value available for pattern data re-generation at ECC decode time. Also, in the case of fixed/static pattern data at least, the same pattern data source (e.g., set of nodes coupled to ground and/or VDD) may supply pattern data to both the enlarged RS encoder and enlarged RS decoder (i.e., only one pattern data source need be implemented).

Referring specifically to detail view 153 of data expander/ECC decoder 125, each of the $2^q$ enlarged RS decoders (generically, 163) outputs an error syndrome together with error-corrected (if necessary/possible) message data, the latter constituted by 2*V bits that include the V-bit application data block together with V bits of merged pattern data/metadata. Syndrome comparator 169 evaluates/compares the $2^q$ error syndromes, identifying one of those syndromes as reflecting one fewer symbol errors than the others and outputting a q-bit index corresponding to the RS decoder that sourced that fewest-symbol-error syndrome as the recovered metadata value. As shown, the recovered metadata is supplied to multiplexer/selector circuit 171 to select, as the read-back (and possibly error-corrected) application data block, the V-bit application data block from the RS decoder that sourced the fewest-bad-symbol syndrome. Note that the remaining V bits of metadata-selected RS decoder output may be dropped/ignored as those bits merely constitute locally generated content (the pattern data) and metadata (already recovered). In alternative embodiments in which RS decoder indices do not correspond one-for-one with corresponding metadata values, multiplexer 171 may pass both the application data block and the metadata components (V+q bits) output by the syndrome-identified RS decoder (i.e., in response to the q-bit index output from syndrome comparator 169) to downstream logic.

Still referring to FIG. 1, capabilities and configuration of physical memory (DIMMs in the depicted example) may bear on data-expander/encoder and data-expander/decoder implementations—for example, matching the RS symbol size (m) to the data interface width 't' of an individual DIMM-mounted memory device (or an integer multiple or divisor thereof) to enable application data recovery (and thus ongoing system operation) despite a failed memory device (i.e., where every symbol output from that memory device is bad). In the FIG. 1 embodiment, for instance, the application data block and ECC generated by data expander/ECC encoder 121 are forwarded to I/O circuitry 123 which, in turn, transmits those block components (application data block and ECC) to a selected DIMM via respective data channel and ECC channel components of memory channel 105. By implementing the enlarged RS decoder to have (i) a symbol size m that matches (or is an integer multiple) the memory device width 't' and (ii) an error correction capability ((n−k)/2) that matches or exceeds the total number of symbols written to/read-back from an individual memory device in a given memory access (write or read) transaction, the RS encoding/decoding will enable recovery of data written to a failed memory device (i.e., for which all data output is nominally corrupted/bad). Referring to the I/O circuit embodiment shown in detail view 117, a serializer/deserializer circuit 127 serializes each outgoing application data block data for burst transmission (per-link serializer/deserializer 131 generating multiple serial bits per link via output driver circuits 133 (and deserializing serial bits received via counterpart receivers 135 during read data receipt)) to a number (N) of memory devices over an N*t bit data channel, where the burst length 'b' (number of bit-time intervals per application data block transmission) is set according to the ratio of the application data block size (V) to the data channel width (N*t) so that b=V/N*t. Likewise for the outgoing ECC—serialized for transmission to a number (E) of memory device over and E*t bit ECC channel, again with burst length 'b'. Accordingly, by setting (i) RS symbol size 'm' to match memory device width 't' (and the burst length to the value of t or multiple thereof) so that each memory device will store an integer number (b/t) of symbols per write data transaction (and output that same integer number of symbols per read transaction), and (ii) setting the RS error correction capability (n−k)/2 to meet or exceed b/t (the number of symbols stored per memory device per write transaction—i.e., per application data block), application data blocks written to the subject DIMM may be recovered on data read-back despite systemic failure of a single memory device, thus permitting ongoing memory system operation albeit with greater exposure to random (non-systemic) symbol error.

Device-failure tolerance is achieved in various embodiments of the FIG. 1 memory system by implementing the data-expander/encoder/decoder circuitry in accordance with application data block size (V), memory channel width in bits and number of connected memory devices (N+E)—i.e., implementing the RS encoders/decoders to effect an m-bit symbol size that matches the channel width divided by N+E (and thus the per-memory-device interface width 't') and an error correction capability that meets or exceeds the number of symbols stored in each individual memory device per write data burst (i.e., b/m). As a specific example, in a memory system populated by one or more DIMMs each having two independent 40-bit memory channels (32-bit data channel, 8-bit ECC channel), 16-byte application data block size (so that burst length=4), and either 4-bit or 8-bit memory-device interface widths (e.g., in compliance with the JEDEC DDR5 standard), a distinct/dedicated controller-side signaling interface 115 may be implemented for each data channel with RS encoder/decoder parameters (n'=n+k, k'=2 k, m), where m=8, k=16*8/m and n+k=20*8/m. That is, RS (36, 32, 8), with each 16-byte application data block and ECC conveyed to 10×4 memory devices or 5×8 memory devices. ECC encoding/decoding may be implemented with numerous other RS parameters according to characteristics of the subject memory system and error detection/correction objectives.

FIG. 2 illustrates an exemplary syndrome comparator embodiment 180 that may be used to implement syndrome comparator 169 of FIG. 1. As shown, the syndrome comparator includes an error comparator circuit 181 that compares the $2^q$ incoming syndromes (S0 to S($2^q$−1)) and encodes, as the recovered metadata value, an q-bit index corresponding to the syndrome reporting one fewer bad symbols than the others. That index (metadata value) is supplied to multiplexer 183 to select the corresponding syndrome (i.e., reporting one fewer bad symbols than the others) as the finalized syndrome of the RS decoding operation.

FIG. 3 presents an exemplary listing/tabulation of actions implemented by the FIG. 2 syndrome comparator for various syndrome status conditions and corresponding bad-symbol counts. Where the incoming application data block contains no (zero) bad symbols, the syndrome from the RS decoder receiving the correct metadata value (i.e., matching the metadata encoded into the ECC during data write) will report zero bad symbols, while the syndromes from the other RS decoders will each report one bad symbol (as none of the metadata values supplied to those decoders matches the metadata encoded into the ECC during data write). Accordingly, the syndrome comparator outputs the syndrome reporting zero bad symbols together with the corresponding metadata value (e.g., encoding the output metadata as the index of the RS decoder that supplied the zero-error syndrome).

Continuing with FIG. 3, where the application data block contains a correctable number of bad symbols (1 to (n−k)/2 bad symbols), one of the syndromes will report that number of bad symbols, while the others report one additional bad symbol (i.e., 2 to 1+(n−k)/2 bad symbols) due to the incorrect metadata values supplied to their RS decoders. Accordingly, as in the zero-bad-symbol case, the syndrome comparator outputs the syndrome reporting the fewest bad symbols and the corresponding metadata value. As the application data block contained a correctable number of bad symbols, those symbols are corrected in RS decoded application data (i.e., both the finalized application data block and the metadata are error-free/good).

The next two entries in the FIG. 3 table correspond to application data blocks having a detectable but not correctable number of bad symbols—from 1+(n−k)/2 bad symbols to n−k bad symbols, with the n−k case presented separately to emphasize optional/programmable syndrome-comparator behavior. Taking the bad-symbol count greater than (n−k)/2 and less than n−k first, the syndrome comparator behaves as in the first two table rows, outputting the syndrome reporting the fewest bad symbols and corresponding metadata. In this instance, the metadata is confirmed to be correct (good) while the application data block is reported (by the output syndrome) to have between 1+(n−k)/2 and (n−k−1) uncorrected symbols—data is bad. In the n−k bad-symbol case (fourth row of FIG. 3 table), the syndrome from the RS decoder receiving the correct metadata value will report n−k bad symbols, while the syndromes from the other RS decoders will each report a "bogus" value indicating an indefinite number of symbols greater than n−k. In one embodiment the syndrome comparator action in this instance is established by a programmed policy setting (e.g., within a programmable register or other configuration circuit) to interpret the bogus-valued syndromes as reflecting either (i) exactly n−k bad symbols within the application data block plus one bad symbol resulting from invalid metadata (i.e., so that the n−k+1 bad symbols exceeds the bad-symbol reporting threshold), or (ii) an unknown number of symbol errors within the application data block and thus a lack of trust in the syndrome reporting n−k bad symbols. In the first instance (bogus-valued syndromes interpreted as reporting n−k bad symbols in application data block), the syndrome comparator executes the same action as in the prior table rows—outputting the syndrome that reported the fewest bad symbols (n−k) together with the corresponding metadata value. Note that with this action, the overall data-expander/RS decoding exactly the matches the behavior and performance of a conventional RS decoder (i.e., no functionality is compromised). In the second instance (lack of trust in syndrome reporting n−k symbols), the syndrome comparator outputs a bogus-valued syndrome to indicate both the application data block and metadata are bad (outputting, for example, the metadata corresponding to the (n−k)-reporting syndrome). If all the syndromes report bogus values (final line of FIG. 3 table), the syndrome comparator outputs any of those syndromes (e.g., the syndrome sourced by the RS decoder having the lowest index) to indicate that both the application data block and metadata are bad (outputting, for example, the index of the syndrome-sourcing RS decoder as the metadata).

While FIGS. 1-3 have been described with respect to Reed-Solomon encoder/decoder implementations, any practicable block-code encoding/decoding schemes (e.g., other linear block code encoders, other polynomial code encoders) may be used in alternative embodiments. Also, in some embodiments (including embodiments with block-code or polynomial encoder/decoders other than the RS encoders/decoders shown), the input message length after adding combining the metadata bits, application data block and any pattern data may be less than twice the size of the original application data block (i.e., between V+q and 2V−1, inclusive). More generally, the reference to application data block herein refers to data from any practicable source within the host system (e.g., operating-system data, hardware-function-related data, process data, etc.) and the host system itself may be any computing device or other device requiring data storage and retrieval (e.g., smartphone or other handheld computing device or appliance, laptop computer, network appliance, smart television or other home appliance, etc.). Similarly, though DIMM-mounted memory devices and interconnects thereto are depicted in FIG. 1, physical memory may be implemented in any practicable arrangement and form factor (e.g., system-in-package having one or more memory dies, IC-package-based memory module, etc.). Also, while referred to herein as metadata, the ECC-encoded (over-capacity) data may be constituted by any type of data from any source, and while the amount of ECC-encoded data (q) is generally expected to be small (e.g., 2 bits per application data block to support Compute Express Link (CXL) or similarly small number of bits to support other cache-coherent interconnects), q may generally have any practicable value up to the application data block size (V) or up to the message length (ML—the size of the data input at ECC encoder) less the application data block size (V) where data is expanded (at the RS encoder/decoder input) beyond the application data block size. That is, q may have any practicable number satisfying the condition q≤ML−V. Additionally, while RS encoding/decoding operations have been described in terms of individual encoders/decoders that operate on an expanded message size (e.g., twice the application data block size in the FIG. 1-3 embodiments), each RS (n'=n+k, k'=2*k, m) encoder/decoder may be implemented by two or more component encoders/decoders. FIG. 4, for example, illustrates an RS (80, 64, 4) encoder implemented by two component RS (40, 32, 4) encoders, or by four component RS (20, 16, 4) encoders, etc. RS decoders may likewise be implemented by component decoders to achieve a desired decode sequence, including component decoders that operate with respect to staggered input data arrival times as shown, for example, in FIG. 5—four component RS (20, 16, 4) decoders operating respectively on successively received portions of application data block, with component syndrome values merged within merge circuitry 201 to yield final per-decoder syndrome. In yet other embodiments, the $2^q$ parallel RS decoders shown in FIG. 1 may be implemented by one or more iteratively cycled RS decoders, each such decoder generating a corrected application data block and syndrome per iteration with respect to per-iteration incremented metadata value. FIG. 6 illustrates such an approach using a single RS decoder to carry out $2^q$ RS decode operations each with respect to the same application data block, ECC value and pattern data (buffering those values as necessary to ensure their availability, 203), and with a counter-incremented q-bit metadata value (q=2 in the depicted example). The syndrome and corrected application data block generated in each RS decode iteration may be buffered as necessary (205) to enable syndrome comparator operation and finalized application data block selection (e.g., as shown in FIG. 2).

The metadata-sequencing component of FIG. 6—depicted as a counter ("cntr")—may generate candidate metadata values according to any useful count sequence (e.g., count-up, count-down, gray-code counting or other encoded counting rather than binary counting, etc.) and more generally may increment the per-iteration metadata in any practicable sequence, including non-linear sequences, tabulated and/or algorithmically-generated sequences (the latter including, for example and without limitation, heuristically-generated metadata sequences, adaptively-generated sequences, etc.). In a number of iterative RS decoding embodiments discussed below, a metadata-sequencing engine leverages known or observed metadata value proclivities/likelihood to ascertain the correct metadata output (i.e., an RS decode yielding a zero-error syndrome or one-fewer-error syndrome and thus detection of correct/recovered metadata bit pattern—a metadata "hit") with minimal RS decoder iteration, avoiding the incremental latency and power consumption of successive decode iterations while retaining the reduced die area benefit relative to a fully-parallel implementation (i.e., decoding engine having $2_q$ parallel RS decoders).

In an iterative RS decoder having a fixed number of RS decoders (P), the potential for power/latency reduction due to early-round detection grows according to the worst-case number of decoding rounds ($2^q/P$) and thus with metadata size (q). In a dual encoder implementation as an example (P=2), a first round metadata hit reduces decode time and power by approximately 50% for a 4-bit metadata value (avoiding the second of two rounds), 75% for an eight-bit metadata value (avoiding the final three rounds), 87.5% for a 16-bit metadata value (avoiding the final seven rounds), 93.75% for a 32-bit metadata value (avoiding the last 15 of 16 rounds), and so forth. While these power/latency savings motivate a larger q:p ratio, metadata sized beyond the RS symbol size (q>m) brings additional complexity in assessing a metadata hit. More specifically, metadata sized less than or equal to RS symbol size (m)—i.e., such that a candidate metadata value falls entirely within one of the 2*k symbols supplied to an RS decoder—any exceptional syndrome, regardless of symbol error count, may be construed as a dispositive hit with respect to the corresponding candidate metadata (i.e., confirmation that the candidate metadata value is the correct/actual metadata value). By contrast, where metadata size exceeds RS decoder symbol size (and thus spans two or more RS message symbols), an incorrect candidate metadata value may yield a variable number of symbol errors from one to the number of spanned symbols (e.g., a 16-bit candidate metadata value may yield zero, one, two, three or four errors within an RS decoder having a 4-bit symbol size), meaning that a dispositive metadata hit occurs only where an RS decode yields a zero-error exceptional result (i.e., one syndrome indicates zero symbol errors any/all others in a given round indicating one or more symbol errors—referred to herein as an "error-free" exception) and, conversely, no dispositive metadata hit is confirmed by a non-zero-error exceptional result (an "error-laden" exception") while candidate metadata values remain to be decoded. Moreover, because a given error-laden exception may in fact correspond to the correct/actual metadata value—a fact to be proved/disproved, for example, by comparing the symbol-error-count corresponding to the given exception with the symbol-error counts of any later-round exceptions—an iterative multi-symbol RS decoder may need to temporarily buffer (store) the application data, metadata and syndrome corresponding to any non-final-round exception in the event that it is to be output as the finalized recovered data set (application data, metadata and syndrome). For purposes of differentiating the various RS decoding engines disclosed herein, iterative RS decoding embodiments herein that generate proclivity-leveraged metadata sequences (i.e., to increase likelihood of early-round metadata hit) are referred to herein as opportunistic decoders, with those embodiments being further distinguished as multi-symbol or single-symbol decoders according to whether the RS symbol size is or is not exceeded by the metadata size, respectively.

FIG. 7 illustrates an embodiment of an single-symbol opportunistic RS decoder 300 having a metadata sequencer 301, pattern-data generator 167, set of 'P' data-expanded RS decoders 163$_0$-163$_{P-1}$ (where $2^q/2 \geq P \geq 1$), syndrome comparator 303 and candidate multiplexer 305. Metadata sequencing engine 301 responds to an incoming data-valid signal ("vDat"—indicating valid application data and ECC data at the decoder input) by enabling iterative RS decoding within RS decoders 163$_0$-163$_{P-1}$ with respect to the application data (AD) and ECC data in combination with pattern data from generator 167 and successive sets of quantity-P metadata values (referred to herein as candidate metadata values as decoder 300 iteratively searches for the one metadata candidate that corresponds to the correct/actual metadata originally used to generate the ECC data) that are sequenced according to predetermined and/or run-time-observed bit-state proclivities. As in the more generalized FIG. 6 embodiment, the incoming application data (AD) and ECC data are buffered as necessary (optional buffers 310, 312) to ensure their availability at inputs of RS decoders 163$_0$-163$_{P-1}$ for multiple decoding iterations (also referred to herein as decoding "rounds" or "cycles"). Thus, each RS decoder receives, during each decoding round, a 2V-bit data input constituted by the V-bit application data and (V-q)-bit pattern data together with a unique q-bit candidate metadata value such that, over $2^q/P$ decoding rounds (should that maximum number of iterations be required to yield a meta-data hit), the same application data and pattern data will be decoded in combination with each possible metadata bit pattern. As in embodiments discussed above, decoders 163$_0$-163$_{P-1}$ generate respective error syndromes (syndrome[0]-syndrome(P-1]) and 2V-bit data outputs, each of the latter being nominally error detected/corrected and constituted by V-bit application data (AD$_{EDC}$), q-bit metadata value (MD$_{EDC}$) and V-q pattern bits. The application data, metadata and syndrome output from each RS decoder (generically/collectively, 163) is supplied to a respective port (0, . . . , P-1) of candidate multiplexer 305, with the syndrome values additionally supplied to syndrome comparator 303 (the V-q bits of pattern data are dropped as shown in the detail view of the decoder 163$_0$ output). Syndrome comparator 303 evaluates the symbol-error counts specified by respective syndromes for a given decoding round, returning an exception signal ("excp") to metadata sequencer 301 in response to a syndrome indicating fewer symbol errors than all others in that decoding round (i.e., an "exceptional" syndrome, result or error count) and asserting a candidate-select signal ("csel") at the select-input of multiplexer 305 corresponding to the RS decoder that yielded the exception. In this single-symbol embodiment (metadata size, q, less than RS symbol size, m), sequencer 301 asserts metadata-hit signal ("hit") in response to exception signal assertion thereby confirming that the application data, metadata and syndrome output from multiplexer all resulted from a metadata hit (alternatively, the exception signal from syndrome comparator 303 may be output as the metadata hit signal).

FIG. 8 illustrates an exemplary operation of the metadata sequencer of FIG. 7 in response to incoming control signals, including the data-valid signal discussed above and a load signal used to load updated/initializing metadata ("MDu" in FIG. 7) into constituent tabular and/or predictive sequencing circuits. As shown, the metadata sequencer responds to data-valid assertion (affirmative branch at 331) by executing the operations shown at 333—that is, outputting P candidate metadata values (cMD[0]-cMD[P-1]) for decoding cycle 'i' (where 'i' is a loop/iteration index that is reset to zero prior to commencement of an iterative decode) and then asserting the decode-enable signal (enDec) to enable operation of corresponding RS decoders (i.e., decoders 163 in FIG. 7). If the syndrome comparator signals an exception and a fixed-latency option is disabled (affirmative determination at 335, negative at 337, the latter controlled, for example, by a Cnfg field setting), the sequencer concludes the metadata search by signaling the metadata hit (asserting the "hit" signal) and resetting the loop index at 339. When a metadata hit occurs with fixed-latency enabled (affirmative determinations at 335 and 337), the sequencer defers signaling the metadata hit (and other operations at 339) until a latency timer/counter expires (affirmative determination at 343) thus enabling metadata hit/miss signaling with deterministic timing (while retaining the power-saving benefit of early hit detection).

As discussed below, one or more configuration control fields (e.g., "Cnfg" output of a host programmable register supplying as shown in FIG. 7) may selectively enable either table-based or adaptive/predictive metadata sequencing and also supply initializing information and other sequencing control information. Where the metadata sequencer is configured to adaptively predict candidate metadata values (i.e., run-time updated metadata sequencing according to a programmably-selected or hard-wired heuristic, algorithm, etc.), the sequencer may additionally update history data at 339 according to the metadata hit result—generating one or more data sets that indicate which candidate metadata values are more likely than others to yield a metadata hit and leveraging that information for run-time adaptation of metadata sequencing (i.e., to minimize number of decode cycles per vDat-triggered metadata search). In the FIG. 7 embodiment, for example, the candidate-select signal (csel) from syndrome comparator 303 is supplied to both multiplexer 305 and sequencer 301, with the latter applying that signal to load a corresponding one of candidate metadata values cMD0-cMD[P−1] into a history accumulator (e.g., adjusting bit-state history counters according to the logic states of respective bits within the finalized/output metadata value). In an alternative embodiment, the final metadata value output from multiplexer 305 is returned to metadata sequencer 301 for purposes of history-data update.

Returning to FIG. 8, the metadata sequencer responds to a load signal assertion (affirmative at 345) by loading metadata update(s) (MDu), search-hit or "result" metadata data (rMD), and/or history-initialization data (Init) into the metadata sequencer at 347, for example, to update/initialize contents of history-data accumulators (rMD, Init) for purposes of adaptive metadata sequencing (i.e., updating predicted metadata sequences according to run-time results) and/or to initialize/update contents of metadata-sequencing tables (MDu) applied during tabulated sequencing.

FIG. 9 illustrates an exemplary metadata sequencer 360 capable of executing the opportunistic sequencing and data-load/update operations shown in FIG. 8 and that may implement sequencer 301 of FIG. 7. In the depicted example, metadata sequencer 360 includes a finite state machine 361 (or processing unit or other control circuit) together with predictive and tabulated sequencing engines (363, 365), output multiplexer 367 and predictor-load multiplexer 369. Metadata-source (Src), data-initialization (Sd) and latency-control (FL) signals within an incoming configuration value (i.e., from configuration register 371 which may be disposed within sequencer 361 or elsewhere within the host memory control component) specify, respectively, which of the predictive and tabulated sequencing engines is enabled to supply candidate metadata values, initialization data to be loaded into data-history accumulators within predictive sequencing engine 363 (e.g., during initialization, at reset or other event, or otherwise in response to host instruction), and enablement of optional fixed-latency hit-signal assertion (e.g., deferring assertion of metadata hit signal following early-round metadata-hit as discussed in reference to FIG. 8). When the metadata source signal specifies tabulated metadata sequencing (e.g., Src=0 in this example), state machine 361 responds to an incoming data-valid signal (vDat) by iteratively pulsing both a sequence-advance signal (adv) and the aforementioned decode-enable signal (enDec)—delaying between sequence-advance pulse and corresponding decode-enable pulse as necessary to ensure adequate candidate-metadata setup time at the sequencer output. Each sequence-advance pulse incrementally advances a table-entry pointer through a pre-loaded table of candidate metadata values within tabular sequencing engine 365 (e.g., implementing a lookup table), thereby outputting a respective set of tabulated metadata values (tMD[P−1]-tMD[0]) during each RS decoding round. In the depicted example, the tabulated metadata values are forwarded to the metadata sequencer output via multiplexer 367, thus becoming the candidate metadata values discussed above. A similar operation is carried out within predictive sequencing engine 363 when enabled by the metadata-source control (e.g., Src=1)—generating sequential sets of P "predicted" metadata values (pMD[P−1]-pMD[0]) in response to FSM pulsing of the advance signal, with each such set of predicted metadata values output via multiplexer 367 as the candidate metadata values applied in a respective decoding round. Regardless of candidate metadata source (tabular sequencing engine 365 or predictive sequencing engine 363), FSM 361 responds to an exception signal by asserting the metadata hit signal (hit), idling the decode-enable signal (i.e., discontinuing enDec pulsing and thus forgoing/avoiding execution of any remaining RS decoding rounds), and issuing control signals as necessary to reset the enabled metadata-sequencing engine (tabular or predictive) in preparation for subsequent valid-data signal assertion (i.e., RS decoding with respect to a new incoming data set). In one embodiment, for example, the FSM issues a reset signal (not specifically shown) to reset pointer generators/counters within the enabled sequencing engine. Alternatively, the FSM may continue pulsing the sequence-advance signal to wrap a counter-based pointer generator back to a starting sequence count.

Still referring to FIG. 9, where predictive sequencing engine 363 is selected as the candidate metadata source (i.e., Src=1 in this example), FSM 361 additionally pulses an update signal (updt) in response to exception signal assertion, thereby updating bit-state history accumulators (or counters) within the predictive sequencing engine according to the metadata value that yielded the metadata hit—the result metadata value (rMD) being delivered to the predictive sequencing engine in the FIG. 9 embodiment via multiplexer 369 (i.e., as the csel-specified candidate metadata value corresponding to the final output metadata value). As discussed below, the history accumulator outputs are applied to effect run-time adaptation (revision) of predicted metadata sequences—dynamically adjusting the candidate metadata sequencing order according to run-time observed results. FSM 361 additionally updates/re-seeds tabular/predictive metadata sequences within engines 365/363 in response to load instructions ("Load") issued by the host capacity-expanding memory controller (or host device directing the memory controller) during system initialization and on occasion thereafter (e.g., in response to events/inputs indicating that revision/reset may reduce the average decode cycle count required to yield a metadata hit). In the FIG. 9 implementation, for example, FSM 361 responds to load signal assertion by either pulsing an update signal (updt) one or more times to load updated metadata values (MDu) into one or more internal tables of tabular sequencing engine 365 (i.e., where tabular sequencing specified by Src control) or, when predictive metadata sourcing is enabled, by pulsing a load-seed signal (sLd) to re-seed metadata history accumulators within predictive sequencing engine 363—for example, strobing one or more seed values (Sd) from configuration register 371 into the accumulators to initialize or overwrite contents thereof.

FIG. 10 illustrates an exemplary tabular sequencing engine 390 (i.e., that may implement tabular sequencing engine 365 of FIG. 9) having a metadata look-up table 391, row-pointer generator 393 and load port 395. Row-pointer generator 395 (e.g., implemented by a counter) advances a row-pointer through the LUT in response to advance-signal assertion (enabling the FIG. 9 FSM to sequence through the table rows) such that respective sets of P metadata values are output from sequencer 390 in successive RS decoding rounds. Load port 393 serves as an interface to enable updated metadata (e.g., each update including a row-wide set of P metadata values in one embodiment) to be loaded/written into a pointer-selected row of table 391. The FSM may select successive table locations for metadata load by pulsing the advance signal (and thus advance the row pointer from generator 395), or may separately address and update the table via the load port. Any practicable architecture that enables table sequencing (progressive selection of table rows to effect candidate metadata sequencing) and update may be implemented in alternative embodiments.

FIG. 11 illustrates an embodiment of a temporal-locality metadata predictor 410 that may be deployed as the predictive sequencing engine in FIG. 9. In the depicted example, predictor 410 includes a sequence counter 411, history accumulator 413, locality comparator 415, count-increment logic 417 locality-weighted toggler 419 and polarizer 421 that cooperate to adaptively update a metadata search sequence according to temporal bit-state locality indicated by past metadata search results. That is, metadata values are searched in order of highest hit rate to lowest, with the hit rates updated following each metadata hit (with optional filtering) so that, as metadata trends change over time or in response to conditions/events, so does the predictive search order.

In the FIG. 11 implementation, sequence counter 411 responds to the sequence-advance signal (i.e., from FIG. 9 FSM 361) by incrementing a count value 'A' (having q constituent bits a[q−1:0]) in a linear, modulo count sequence (e.g., 0, P, 2P, . . . , $2^q$−P, 0, P, . . . ). The step-by-P output count value is supplied to locality weighted toggler 419 directly and via a chain of P−1 incrementing circuits (forming count-increment logic 417) such that, for each value of 'A', toggler 419 receives P count inputs: A, A+1, . . . A+P−1. Toggler 419 additionally receives a set of q temporal-locality scores (tls) from locality comparator 415, with those scores indicating relative temporal localities of the q metadata bits—for example, which of those bits shows a maximum temporal locality (likelihood of being in a particular logic state and thus most predictable), which shows the next-highest temporal locality, and so forth to the metadata bit showing the lowest temporal locality (most unpredictable/random). Toggler 419 re-orders constituent bits within incoming linear count values (A, A+1, . . . , A+P−1) according to the temporal locality scores to yield a corresponding set of output values (B, B+1, . . . , B+P−1) each having constituent bits (b[q−1:0]) that toggle at intervals in proportion to their temporal localities. For example, if the temporal locality score for the 5th metadata bit position (i.e., tls[4]) indicates that bit position to have the highest temporal locality, toggler 419 will toggle output bit b[4] at the lowest rate (longest interval between toggles) and thus in response to transition of the most-significant bit ($q^{th}$ bit) of the linear input count (A). Conversely, if the temporal locality score for the $q^{th}$ metadata bit position (tls[q−1]) shows the lowest temporal locality, toggler 419 will toggle output bit b[q−1] at the highest rate (every count cycle and hence with shortest interval between toggles) and thus in response to the least significant bit of the linear input count (A).

In the FIG. 11 embodiment, history accumulator 413 is implemented by a set of q two's-complement history counters 425—one for each bit of a search-result metadata value (rMD)—that are incremented or decremented in response to an update signal (updt) according to respective logic states ('1' or '0') of corresponding rMD bits. Thus, for a histogram counter 425 initially at zero, a sequence of logic 1 bits (and count-triggering update pulses) will yield an increasingly positive history count value, while a sequence of logic 0 bits will yield an increasingly negative history count. As shown, each of the d-bit history count values output by respective counters 425 (i.e., hist[q−1]-hist[0]) includes a sign bit (sign[q−1]-sign[0]) and a magnitude field (mag[q−1]-mag[0]), with the latter supplied to locality comparator 415 (a collection of comparators that generate the temporal locality selector values in accordance with the relative magnitudes of each of the q history counts), and the former (the sign bits) supplied to polarizer 421. Polarizer 421 selectively flips the logic states of constituent bits within each the locality-weighted toggler outputs (B0, B1, BP−1) according to the sign of the corresponding history count to establish an initial logic state, '1' or '0' for each bit of each metadata value. Thus, if the sign of the history count for a given metadata bit indicates a positive accumulation (logic '1' more likely than logic '0'), the logic state of the corresponding bit (within a toggler output value) is flipped from an otherwise initial '0' state (owing to the linearly incremented output of sequence counter 411 to an initial '1' state. Conversely, if the history-count sign indicates a negative accumulation (more logic '0' values accumulated than logic '1' values), the logic state of the corresponding bit is maintained in its initial '0' state. In the case of a two's complement sign bit (i.e., '0' indicates positive, '1' negative), the desired output bit polarities (input bit flipped/inverted in response to '0' valued sign bit, output without change in response to a '1' valued sign bit) may be achieved in an XNOR of the sign bit and input bit—for example, polarizer 421 implementing a respective set of q XNOR gates for each of P toggler output values (B0, B1, BP−1), yielding at the polarizer output a set of P predicted metadata values (pMD[P−1]-pMD[0]).

An example of the MD predictor operation for q=4, d=10 (10-bit two's complement counter providing a count range between −512 and +511) is shown in FIG. 11 at 430, with initial history counts for the q metadata bits chosen arbitrarily as +121 for bit 0, −203 for bit 1, +509 for bit 2, and +25 for bit 3 to illustrate the resulting predicted metadata output sequence. As discussed above, locality comparator 415 compares the magnitudes of the history count to generate a set of q temporal-locality scores and thus the highest score for the +509 history count (metadata bit position 2, starting from 0), the next highest score for the −203 history count (metadata bit position 1), the next highest for the +121 history count (metadata bit position 0) and the last for metadata bit position 3 (history count +25). The sign bit for the −203 history count is a logic '1' (indicating negative—accumulation of predominantly '0'-valued metadata bits) while all others are logic '0' (positive—accumulation of predominantly '1'-valued metadata bits). The temporal locality scores are supplied to multiplexers 431 within toggler 419 (there being, for example, a separate set of such multiplexers for each of the P count values input to locality-weighted toggler 419) which, in turn, toggles an output bit in accordance with a locality-weighted input toggle source. In this case, as metadata bit position 2 exhibits the highest temporal locality score, b[2] is toggled in response to the lowest toggle-rate count-input bit (i.e., a[3] is selected to be output as b[2]), whereas metadata bit position 3 exhibits the lowest temporal locality score and is thus sourced by the highest toggle-rate count-input bit (i.e., a[0] is output as b[3]). Finally, the polarizer flips the signs of respective bits according to logic '1' or logic '0' predominance so that a linearly incremented input count from sequence counter 411 (i.e., 0000, 0001, 0010, . . . 1110, 1111) will yield initial bit states in the predicted metadata output according to that predominance. The exemplary table at 435 shows the predicted metadata sequence, demonstrating the starting state of each metadata bit according to predominant bit-state accumulation ('1' or '0'), and the toggling of each bit in inverse order to its temporal locality—in a simplified P=1 example, toggling pMD[3] every search cycle, pMD[0] every other search cycle, pMD[1] every fourth search cycle, and pMD [2] once following the eighth search cycle. In a more generalized P>1 case, the same predicted metadata pattern will be generated, with a respective, contiguous set of the pMD values shown in table 435 being output during each decoding (search) cycle.

Referring still to FIG. 11, each of the history counters 425 within accumulator 413 optionally includes a parallel-load input to enable the counter to be pre-loaded with a seed value (e.g., for purposes of establishing/biasing initial behavior of the predictor). In the specific example shown, each counter is loaded, in response to seed-load signal assertion (sLd) at its parallel-load-enable input (ple), with a respective seed value (Sd[q−1]-Sd[0]), overwriting any count value therein. Though not specifically shown, predictor 410 may include additional circuitry to avoid history-counter overflow (e.g., right-shifting magnitudes of all history counters when a given counter reaches a saturation/terminal count, saturating the counter at its maximum positive or negative count value, etc.), enable iterative operation of locality-weighted toggler and/or polarizer (i.e., sequentially generating each of P output values and thereby obviating requirement for parallel logic circuitry such as P instances of the toggler-multiplexer circuitry shown in the example at 431), etc. Further while the predictive sequencing engine of FIG. 11 primarily leverages temporal locality, additional or alternative sources of predictive information may be exploited (e.g., context switch, addressed region of external memory, etc.). More generally, any algorithmic, heuristic, neural or other modeling may be applied to drive metadata predictions in alternative embodiments.

FIG. 12 illustrates an embodiment of an opportunistic RS decoding engine 450 that performs multi-symbol metadata recovery. In the depicted example, decoding engine 450 includes an exception buffer 451 and output multiplexer 453 together with RS decoders $163_0$-$163_{P-1}$, candidate multiplexer 305, pattern-data generator 167, syndrome comparator 455, and metadata sequencer 457 that operate generally as discussed above, with the syndrome comparator 455 and metadata sequencer 457 revised (relative to single-symbol metadata embodiments discussed above) to control exception buffer 451 and output multiplexer 453. More specifically, as a multi-symbol candidate metadata value (i.e., metadata size greater than RS symbol size) may yield a variable number of symbol errors—from zero (metadata-hit) to N, where N is the ratio of metadata size to RS symbol size—an error-laden exception may or may not have resulted from a metadata hit. By contrast, as in the single-symbol embodiments discussed above, any error-free exception dispositively indicates a metadata hit. Accordingly, in one embodiment, the metadata sequencer 457 initiates sequential RS decoding rounds (each with a respective set of P candidate metadata values) until either an error-free exception is detected or all $2^q/P$ decoding rounds have been completed. To enable that operation, syndrome comparator outputs 455, in addition to the candidate-select and exception signals discussed above (csel and excp), a value indicative of the error count ("ect") corresponding to any exceptional result (such error count being, for example, a numeric value, a copy of the exceptional syndrome, etc.). Likewise, sequencer 457 responds to an error-free exception (i.e., exception signal asserted, ect indicates zero errors) by signaling a metadata hit (optionally deferring hit signal assertion if Cnfg specifies fixed-latency operation), and to an error-laden exception by (i) asserting a exception-buffer load signal (xld) to load the exception-associated application data, metadata and syndrome (i.e., output from candidate multiplexer 305) into exception buffer 451 and (ii) storing the error count indicator from the syndrome comparator (e.g., within a minimum-error-count register 459) for comparison with error count(s) corresponding to any subsequent-round error-laden exceptions. If no error-free exception is detected prior to the final decoding round, metadata sequencer 457 initiates the final decoding round and then raises or lowers a result-select signal (rsel) to output the application data, metadata and syndrome associated with the lowest error count via multiplexer 453—either the final-round result output from candidate multiplexer 305 or the minimum-symbol-error contents of exception buffer 451.

FIG. 13 illustrates an exemplary operational flow implemented by a finite state machine, processor or other control circuitry within the metadata sequencer 457 of FIG. 12, not specifically showing load/initialization operations which may be executed as discussed above to populate one or more look-up tables within a tabular sequencing engine and/or initialize/re-seed history data accumulators or other predictive circuitry within a predictive sequencing engine.

As shown, the metadata sequencer responds to reception/detection of a data-valid signal at 471 by initializing an iteration index ('i'), result-mux-select signal (rsel) and stored-minimum-error-count (stm) at 473 (e.g., setting the minimum error count within min-error-count register 459 of FIG. 12 to a maximum value to ensure that first error-laden result will trigger storage of a new, valid minimum error count), and then commencing an RS decode cycle at 475 by outputting candidate metadata values cMD[P−1]-cMD[P] and pulsing the enable-decode signal. If, upon completion of the RS decode cycle 'i', the syndrome comparator signals an error-free exception (exception signal asserted, error-count value shows zero errors thus yielding affirmative determinations at 477 and 479), the sequencer delays as necessary if configured for fixed latency operation (i.e., if affirmative at 481, delaying until timer/counter expiration at 483) and otherwise signals the metadata hit at 485, conditionally updating predictive history data (e.g., if predictive engine enabled as candidate metadata source), for example, by strobing result metadata (rMD) output via FIG. 12 multiplexer 453 into a history-data accumulator as discussed in reference to FIG. 11.

Continuing with FIG. 13, if the syndrome comparator signals an error-laden exception (affirmative determination at 477 and, as symbol-error count is nonzero, negative determination at 479) for any but the final decoding round (i.e., affirmative determination at 487 that ++i<$2^q$/P and thus that the pre-incremented iteration index does not exceed the final-round value of ($2^q$/P)−1), the metadata sequencer compares the stored minimum error count (e.g., within register 459 of FIG. 12) with the new error count from the syndrome comparator at 489. If the new error count is lower (as it would be for a first-time error-laden exception in view of the stored-minimum initialization to a maximum value at 473), the sequencer loads the new error count into the minimum-error-count register at 491 to establish a new stored minimum value (stm), pulsing the exception-buffer-load signal (xld) to load the output of FIG. 12 candidate multiplexer 305 (i.e., the application data, metadata and syndrome corresponding to the newly stored minimum error count) into exception buffer 451, and, because the exception buffer contains the most exceptional result (lowest error count) up to this point, raising the result-select control signal (rsel:=1) to select the exception buffer output to drive the final decoder output via FIG. 12 multiplexer 453. Thereafter, the metadata sequencer commences a new round of RS decoding at 475 corresponding to the iteration index incremented at 487. If the error count signaled by an error-laden exception in a non-final decoding round does not exceed the stored minimum (negative determination at 489), a new decoding round is commenced at 475 without exception buffer load or error count storage thus ensuring that, upon reaching the final decoding round, the stored minimum error count and exception buffer content correspond to the lowest error count found over all decoding rounds up to that point.

If an error-laden exception is detected in the final decoding round (negative determinations at 479 and 487), then (absent an invalid condition as discussed below), then the output from either the FIG. 12 candidate multiplexer 305 or exception buffer 451 constitutes the data corresponding to a metadata hit—depending on which shows the lowest symbol error count. Accordingly, the error count corresponding to the final-round exception is compared with the stored-minimum-error-count at 493. If the final-round error count is less than the stored error count (affirmative branch at 493), the metadata sequencer lowers the result-select signal at 495 to pass the final-round application data, metadata and syndrome as the output result via FIG. 12 multiplexer 453 and then asserts the hit signal at 485 (updating history data if predictive sequencer is selected as candidate metadata source). Conversely, if the final-round error-count is not less than the stored error count (negative determination at 493), the metadata sequencer leaves/maintains the result-select signal in the raised state effected by the operation at 491 to output the exception buffer content via multiplexer 453, and signals a metadata hit with respect to the exception buffer content at 485 (again updating history data if applicable).

Continuing with FIG. 13, for any non-exceptional decoding round (i.e., no exception signal assertion and thus negative determination at 477), the iteration index is incremented and then compared with the decoding-complete value at 497. If the incremented loop index exceeds the final-round value (i.e., is not less than $2^q/P$ and thus negative determination at 497), the metadata sequencer signals a metadata hit with respect to exception buffer content at 485 (i.e., on confirmable-presumption that the operations at 491 have been executed for at least one error-laden exceptional result). Otherwise, if the incremented loop index indicates that any remaining decoding rounds remain to be executed (affirmative determination at 497), the decoding round corresponding to the incremented iteration index is commenced at 475.

Though not specifically shown in FIG. 13, metadata sequencer 457 of FIG. 12 may execute various additional operations/evaluations to safeguard against invalid or anomalous conditions (e.g., no exception in any decoding round, two or more instances of lowest error count, stored minimum error count indicates a number of bad symbols greater than n–k (e.g., as shown in the final table entry of FIG. 3), etc.). In all such cases, the metadata sequencer may refrain from asserting the metadata hit signal, assert one or more additional signals to indicate the invalid/anomalous conditions, and/or take other actions in accordance with invalid/anomalous-condition reporting as set, for example, by programmed policy (e.g., one or more settings programmed within a configuration register such as that shown at 371 of FIG. 9), host instruction, etc.

Referring to FIGS. 1-13 generally, any and all of the capacity-expanding memory controllers presented herein (including those having opportunistic/iterative decoding circuitry) may be implemented within a standalone integrated circuit component or packages or within one or more IC components (including packages having multiple IC dies) that combines the memory control function with one or more other functions (e.g., integrated-circuit processor, application-specific integrated circuit (ASIC), etc.). Also, one or more programmed microcontrollers and/or dedicated hardware circuits (e.g., finite state machines, registered or combinational circuits, etc.) may implement and/or control all or part of the various architectural and functional elements within the memory controller architectures presented herein (e.g., to implement any one or more of the ECC decoders, encoders, pattern data generators, syndrome comparator, etc.). Additionally, any or all of those architectural/functional elements (including the entirety of a over-capacity memory controller architecture according to embodiments herein) may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, the various memory device widths, per-DIMM device counts, singling path widths, data block sizes, message lengths, encoding/decoding schemes and parameters, host interface types, data-unit or symbol sizes (e.g., nibbles, bytes), metadata sizes, error detection/correction capabilities, counter bit-depths, counter architectures, and so forth are provided for purposes of example only—any practicable alternatives may be implemented in all cases. Similarly, signaling link parameters, protocols, configurations may be implemented in accordance with any practicable open or proprietary standard and any version of such standard. Links or other interconnection between integrated circuit devices or internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device or register "programming" can include, for example and without limitation, loading a control value into a configuration register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operational aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit component comprising:
   data receive circuitry to receive a first block of data and corresponding error correction code from one or more external memory components in a memory read operation;
   decoding circuitry to iteratively execute error detection/correction operations with respect to a sequence of input data volumes to generate a corresponding sequence of error syndrome values, the input data volumes each including the first block of data and corresponding error correction code together with a respective, different one of a plurality of q-bit data patterns such that each of the input data volumes is identical to the others of the input data volumes except for the respective different one of the plurality of g-bit data patterns, q being a nonzero integer and the plurality of q-bit data patterns being applied in a predetermined order in successive iterations of the iteratively executed error detection/correction operations in accordance with information obtained from prior transactions with the one or more external memory components such that the predetermined order varies over time; and
   output circuitry to select one of the plurality of q-bit data patterns to be an output q-bit value according to error-count differentiation indicated by the error syndrome values.

2. The integrated circuit component of claim 1 further comprising circuitry to issue a memory read command to the one or more external memory components and wherein the data receive circuitry to receive the first block of data and corresponding error correction code comprises circuitry to receive the first block of data and corresponding error correction code in response to issuance of the memory read command.

3. The integrated circuit component of claim 2 further comprising:
   circuitry to generate the error correction code prior to issuance of the memory read command, the circuitry to generate the error correction code including circuitry to generate the error correction code based on the first block of data in combination with a corresponding q-bit metadata value; and
   data write circuitry to store the first block of data and corresponding error correction code within the one or more external memory components prior to issuance of the memory read command; and
   wherein the output circuitry to select the one of the plurality of q-bit patterns to be the output q-bit value comprises circuitry to output the one of the plurality of q-bit data patterns as a recovered instance of the q-bit metadata value.

4. The integrated circuit component of claim 1 wherein the decoding circuitry to iteratively execute error detection/correction operations with respect to the sequence of input data volumes comprises Reed-Solomon decoding circuitry to iteratively execute Reed-Solomon decoding operations.

5. The integrated circuit component of claim 1 wherein the decoding circuitry to iteratively execute error detection/correction operations with respect to the sequence of input data volumes comprises circuitry to execute a respective set of P error detection/correction operations during each of a plurality of successive error detection/correction cycles, where P is a nonzero integer.

6. The integrated circuit component of claim 5 wherein the circuitry to execute the respective set of P error detection/correction operations during each of the plurality of successive error detection/correction cycles comprises circuitry to execute up to a maximum of $2^q$ error detection/correction operations over $2^q$-divided-by-P error detection/correction cycles.

7. The integrated circuit component of claim 6 wherein the output circuitry to select one of the plurality of q-bit data patterns to be the output q-bit value comprises circuitry to select the one of the plurality of q-bit data patterns to be the output q-bit value after fewer than $2^q/P$ of the error detection/correction cycles have transpired such that detection/correction operations are not executed with respect to the sequence of input data volumes after selecting the one of the plurality of q-bit data patterns to be the output q-bit value.

8. The integrated circuit component of claim 1 wherein the decoding circuitry to iteratively execute error detection/correction operations with respect to the sequence of input data volumes comprises table-lookup circuitry to supply, at a respective input of each of one or more decoder circuits, a sequence of q-bit data patterns in the predetermined order according to storage within the table-lookup circuitry, wherein the sequence of q-bit data patterns constitute at least a subset of the plurality of q-bit data patterns.

9. The integrated circuit component of claim 1 further comprising accumulator circuitry to accumulate, as the information obtained from the prior transactions with the one or more external memory components, information indicative of which of the plurality of q-bit data patterns is more likely to be selected to be the output q-bit value than others of the plurality of q-bit data patterns.

10. The integrated circuit component of claim 9 wherein the accumulator circuitry to accumulate information indicative of which of the plurality of q-bit data patterns is more likely to be selected to be the output q-bit value than others of the plurality of q-bit data patterns comprises circuitry to accumulate temporal locality information over time.

11. The integrated circuit component of claim 1 wherein each error syndrome value within the sequence of error syndrome values indicates how many m-bit symbols of the corresponding input data volume are in error, wherein m is a nonzero integer smaller than q.

12. A method of operation with an integrated-circuit (IC) component, the method comprising:
receiving a first block of data and corresponding error correction from one or more external memory components in a memory read operation;
iteratively executing error detection/correction operations with respect to a sequence of input data volumes to generate a corresponding sequence of error syndrome values, the input data volumes each including the first block of data and corresponding error correction code together with a respective, different one of a plurality of q-bit data patterns such that each of the input data volumes is identical to the others of the input data volumes except for the respective different one of the plurality of q-bit data patterns, q being a nonzero integer and the plurality of q-bit data patterns being applied in a predetermined order in successive iterations of the iteratively executed error detection/correction operations in accordance with information obtained from prior transactions with the one or more external memory components such that the predetermined order varies over time; and
selecting one of the plurality of q-bit data patterns to be an output q-bit value according to error-count differentiation indicated by the error syndrome values.

13. The method of claim 12 further comprising issuing a memory read command to the one or more external memory components and wherein the receiving the first block of data and corresponding error correction code comprises receiving the first block of data and corresponding error correction code in response to issuance of the memory read command.

14. The method of claim 13 further comprising, prior to issuing the memory read command, generating the error correction code based on the first block of data in combination with a corresponding q-bit metadata value and storing the first block of data and corresponding error correction code within the one or more external memory components, and wherein selecting the one of the plurality of q-bit data patterns to be the output q-bit value comprises outputting the one of the plurality of q-bit data patterns as a recovered instance of the q-bit metadata value.

15. The method of claim 12 wherein iteratively executing error detection/correction operations with respect to the sequence of input data volumes comprises iteratively executing Reed-Solomon decoding operations.

16. The method of claim 12 wherein iteratively executing error detection/correction operations with respect to the sequence of input data volumes comprises executing a respective set of P error detection/correction operations during each of a plurality of successive error detection/correction cycles, where P is a nonzero integer.

17. The method of claim 16 wherein executing the respective set of P error detection/correction operations during each of the plurality of successive error detection/correction cycles comprises executing up to a maximum of $2^q$ error detection/correction operations over $2^q/P$ error detection/correction cycles.

18. The method of claim 17 wherein selecting the one of the plurality of q-bit data patterns to be the output q-bit value comprises selecting the one of the plurality of q-bit data patterns to be the output q-bit value after fewer than $2^q/P$ of the error detection/correction cycles have transpired, and refraining from execution of further error detection/correction operations with respect to the sequence of input data volumes after selecting the one of the plurality of q-bit data patterns to be the output q-bit value.

19. The method of claim 12 wherein iteratively executing error detection/correction operations with respect to the sequence of input data volumes comprises supplying, at a respective input of each of one or more decoder circuits, a sequence of q-bit data patterns in the predetermined order according to storage within a table storage structure, wherein the sequence of q-bit data patterns constitute at least a subset of the plurality of q-bit data patterns.

20. The method of claim 19 further comprising loading the table storage structure with the sequence of q-bit data patterns in a table programming operation.

21. The method of claim 12 further comprising accumulating, as the information obtained from the prior transactions with the one or more external memory components, information indicative of which of the plurality of q-bit data patterns is more likely to be selected to be the output q-bit value than others of the plurality of q-bit data patterns.

22. The method of claim 21 wherein accumulating information indicative of which of the plurality of q-bit data patterns is more likely to be selected to be the output q-bit value than others of the plurality of q-bit data patterns comprises accumulating, for one or more of the q constituent bits of the plurality of data patterns, respective count values indicating for each of the one or more of the q constituent bits whether that bit has, in prior selections of output q-bit values, more often been a logic '1' or a logic '0' value.

23. The method of claim 21 wherein accumulating information indicative of which of the plurality of q-bit data patterns is more likely to be selected to be the output q-bit value than others of the plurality of q-bit data patterns comprises accumulating temporal locality information over time within the IC component.

24. The method of claim 12 wherein each error syndrome value within the sequence of error syndrome values indicates how many m-bit symbols of the corresponding input data volume are in error, wherein m is a nonzero integer smaller than q.

25. An integrated circuit component comprising:
means for receiving a first block of data and corresponding error correction code from one or more external memory components in a memory read operations;
means for iteratively executing error detection/correction operations with respect to a sequence of input data volumes to generate a corresponding sequence of error syndrome values, the input data volumes each including the first block of data and corresponding error correction code together with a respective, different one of a plurality of q-bit data patterns such that each of the input data volumes is identical to the others of the input patterns, q being a nonzero integer and the plurality of q-bit data patterns being applied in a predetermined order in successive iterations of the iteratively executed error detection/correction operations in accordance with information obtained from prior transactions with the one or more external memory components such that the predetermined order varies over time; and
means for selecting one of the plurality of q-bit data patterns to be an output q-bit value according to error-count differentiation indicated by the error syndrome values.

* * * * *